United States Patent
Liao et al.

(10) Patent No.: US 11,848,250 B2
(45) Date of Patent: Dec. 19, 2023

(54) THERMAL PEAK SUPPRESSION DEVICE

(71) Applicants: GLOBAL UNICHIP CORPORATION, Hsinchu (TW); TAIWAN SEMICONDUCTOR MANUFACTURING COMPANY, LTD., Hsinchu (TW)

(72) Inventors: Chih-Chieh Liao, Hsinchu (TW); Chih-Feng Cheng, Hsinchu (TW); Yu-Min Sun, Hsinchu (TW)

(73) Assignees: GLOBAL UNICHIP CORPORATION, Hsinchu (TW); TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 385 days.

(21) Appl. No.: 17/226,102

(22) Filed: Apr. 9, 2021

(65) Prior Publication Data
US 2022/0270953 A1    Aug. 25, 2022

(30) Foreign Application Priority Data
Feb. 24, 2021   (TW) ................. 110106422

(51) Int. Cl.
*H01L 23/427* (2006.01)
*H01L 23/433* (2006.01)
*H01L 23/367* (2006.01)

(52) U.S. Cl.
CPC ...... *H01L 23/4275* (2013.01); *H01L 23/3672* (2013.01); *H01L 23/433* (2013.01)

(58) Field of Classification Search
CPC ............... H01L 23/4275; H01L 23/433; H01L 23/3672; F28D 20/02; F28D 20/021; F28D 15/02; F28D 15/04
See application file for complete search history.

(56) References Cited

U.S. PATENT DOCUMENTS

2011/0083436 A1* 4/2011 White ................. F28D 20/02
165/104.19

FOREIGN PATENT DOCUMENTS

JP            09021592 A    *  1/1997

* cited by examiner

*Primary Examiner* — Eric S Ruppert
(74) *Attorney, Agent, or Firm* — CKC & Partners Co., LLC

(57) ABSTRACT

A thermal peak suppression device includes a heat dissipation fin set, a heat dissipator, a thermal phase change material, a filling gas, a fin-array frame and a capillary tube. The heat dissipator includes a thermal conductive block thermally coupled to the heat dissipation fin set, and a closed cavity formed inside the thermal conductive block to have a hot zone and a cold zone. The thermal phase change material is disposed within the hot zone. The filling gas is disposed within the cold zone. The fin-array frame is connected to the thermal conductive block within the cold zone. Two opposite ends of the capillary tube are respectively located within the cold zone and the hot zone. When the thermal phase change material is transformed into a liquid state, the thermal phase change material is sent to the hot zone through the capillary tube.

11 Claims, 4 Drawing Sheets

THERMAL PEAK SUPPRESSION DEVICE

RELATED APPLICATIONS

This application claims priority to Taiwan Application Serial Number 110106422, filed on Feb. 24, 2021, which is herein incorporated by reference.

BACKGROUND

Field of Disclosure

The present disclosure relates to a heat dissipation device. More particularly, the present disclosure relates to a thermal peak suppression device.

Description of Related Art

As cloud services become more popular, high-efficiency semiconductor chips are provided in the related electronics industries, and the semiconductor chips also generate higher heat. Therefore, suitable heat dissipation methods are required to the semiconductor chips for effectively dissipating the heat.

Normally, when a program debugging process to the semiconductor chip (hereinafter referred to a device under test, DUT) is performed, the DUT is electrically conducted for performing the debugging operation. However, during the program debugging process, the semiconductor chip will quickly generate a lot of heat energy, and the heat dissipation efficiency of the heat dissipation means is limited, so that the DUT may be overheated and destroyed, and further caused the effecting of the debugging results.

Therefore, the above-mentioned method still has inconveniences and shortcomings, which needs to be further improved. Therefore, how to effectively solve the above-mentioned inconveniences and shortcomings is one of the current essential research and development topics, and it has also become an urgent need for improvement in related fields.

SUMMARY

One aspect of the present disclosure is to provide a thermal peak suppression device to solve the aforementioned problems of the prior art.

In one embodiment of the present disclosure, the thermal peak suppression device includes a heat dissipation fin set, a heat dissipator, a thermal phase change material, a filling gas, a fin-array frame and a capillary tube. The heat dissipator includes a thermal conductive block that is thermally coupled to the heat dissipation fin set, and a closed cavity that is formed inside the thermal conductive block and divided into a hot zone and a cold zone being in communication with each other. The thermal phase change material is disposed within the hot zone, and used to absorb and discharge heat energy by performing a phase transition between a liquid state and a solid state. The filling gas is disposed within the cold zone. A specific heat capacity of the filling gas is 2000 to 6000 joules/Kg·Kelvin. The fin-array frame is disposed within the cold zone, and fixedly connected to the thermal conductive block. The capillary tube is provided with a first end and a second end which are opposite to each other. The first end and the second end of the capillary tube are respectively located within the cold zone and the hot zone. When the thermal phase change material is transformed into the liquid state, the thermal phase change material in the liquid state is sent to the hot zone of the closed cavity from the cold zone through the capillary tube.

Thus, through the construction of the embodiments above, the present disclosure is able to provide heat suppression function when the semiconductor chip generates high heat energy, thereby effectively suppressing the high heat energy of the semiconductor chip, so as to improve the heat dissipation efficiency, and reduce the possibilities of the semiconductor chip being overheated and destroyed.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Figure 1:
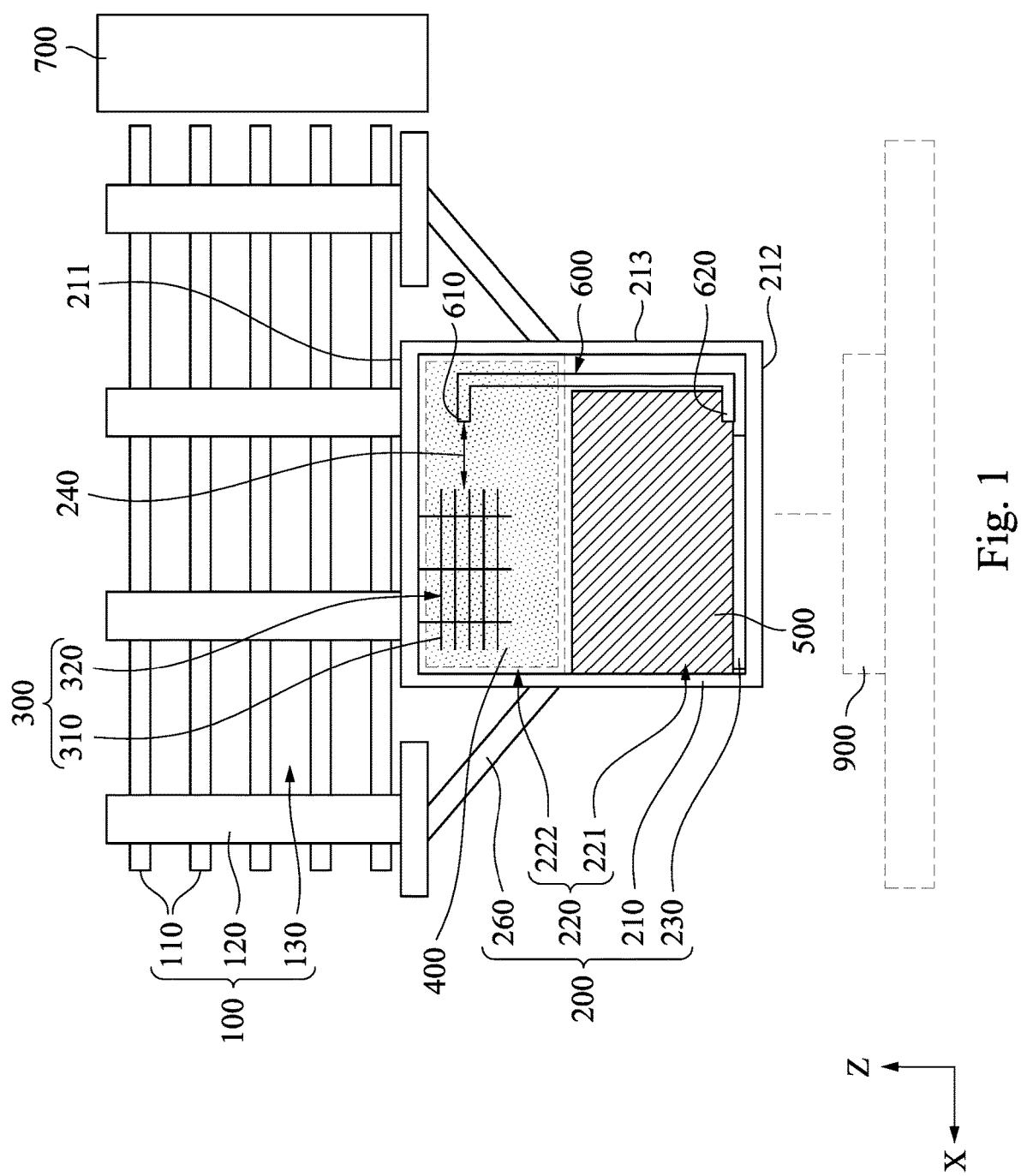
FIG. 1 is a schematic view of a thermal peak suppression device according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Reference is now made to FIG. 1, in which FIG. 1 is a schematic view of a thermal peak suppression device 10 according to one embodiment of the present disclosure. As shown in FIG. 1, the thermal peak suppression device 10 includes a heat dissipation fin set 100, a heat dissipator 200, a fin-array frame 300, a filling gas 400, a thermal phase change material (PCM) 500 and a capillary tube 600. The heat dissipator 200 includes a thermal conductive block 210 and a closed cavity 220. The thermal conductive block 210 is thermally coupled to the heat dissipation fin set 100. More specifically, the thermal conductive block 210 is formed with a first side wall 211 and a second side wall 212 which are opposite to each other. The first side wall 211 of the thermal conductive block 210 is directly connected to the heat dissipation fin set 100. The second side wall 212 of the thermal conductive block 210 is directly connected to a heat source 900 (e.g., a semiconductor element). The closed cavity 220 is formed inside the thermal conductive block 210, and the closed cavity 220 is divided into a hot zone 221 and a cold zone 222 along a gravity direction (e.g., Z axis).

The hot zone 221 and the cold zone 222 are in communication with each other, and no clear distinction can be observed between the cold zone 222 and the hot zone 221. It is noted, the hot zone 221 is closer to the heat source 900 than the cold zone 222, and the cold zone 222 is closer to the heat dissipation fin set 100, so the temperature of the cold zone 222 is lower than the temperature of the hot zone 221. The thermal phase change material 500 is disposed within the hot zone 221 of the closed cavity 220, and absorbs and discharges heat energy by performing a phase transition between a liquid state and a solid state. The most of the thermal phase change material 500 in the liquid state is located within the hot zone 221 of the closed cavity 220, the most of the filling gas 400 is located within the cold zone 222 of the closed cavity 220. The fin-array frame 300 is disposed within the cold zone 222 of the closed cavity 220, and fixedly connected to the inner surface of the thermal conductive block 210. The capillary tube 600 is disposed within the closed cavity 220, and substantially extended along the gravity direction (e.g., Z axis) in the closed cavity 220. The closed cavity 220 is hermetically formed in the thermal conductive block 210, in other words, the filling gas 400 in the closed cavity 220 cannot overflow outwards the thermal conductive block 210 from the closed cavity 220. In the embodiment, the material of the thermal conductive block 210 is metal or alloy, such as copper or aluminum. However, the present disclosure is not limited thereto. In other embodiments, the material of the thermal conductive block 210 may also be a non-metal with a high thermally conductive material. In this way, the thermal conductive block 210 can quickly guide the heat energy of the heat source 900 (e.g., the semiconductor element) to the heat dissipation fin set 100, so as to quickly take the heat energy away from the heat source 900 (e.g., the semiconductor element). An inner surface of the closed cavity 220 being adjacent to the heat source 900 (e.g., the semiconductor element) is provided with a bump 230. The bump 230 is integrally formed on the thermal conductive block 210, and the bump 230 and the thermal conductive block 210 are made of the same material. The thermal phase change material 500 is directly placed on the top surface of the bump 230 so that the thermal phase change material 500 is able to absorb the heat energy of the heat source 900 through the bump 230.

In this embodiment, for example but not limited thereto, the thermal conductivity of the filling gas 400 is between 0.11-0.998 w/(m·° C.), that is, a ratio of the thermal conductivity of the filling gas 400 to the atmospheric air is between 5-7. For example, but not limited thereto, the filling gas 400 is ammonia gas or helium gas. The thermal conductivity of helium gas is 0.11680 w/(m·° C.), that is, the ratio of the thermal conductivity of helium gas to the atmospheric air is 6.18. In addition, the specific heat capacity of the filling gas 400 is 2000 to 6000 J/(Kg·K), for example, the specific heat capacity of helium gas is 5190 J/(Kg·K). The specific heat capacity of ammonia gas is 2055 J/(Kg·K). It is noted that those with ordinary knowledge in the technical field of the disclosure may choose ammonia or helium gas as the above-mentioned filling gas 400.

When the thermal phase change material 500 stores the heat energy into in the liquid state, the thermal phase change material 500 is performed the phase transition. Thus, the thermal phase change material 500 can be performed the phase transition from the solid state to the liquid state, from the liquid state to the gas state, or from the solid state to the liquid state. For example, the thermal phase change material 500 is paraffin (or paraffin wax) or fatty acid. However, the disclosure is not limited thereto. As the thermal phase change material 500 takes the paraffin for example, the paraffin is a substance with a high specific heat and the specific heat is 2200 (J/Kg·K). When the paraffin is in the solid state, the paraffin needs to absorb a large amount of heat energy before being changed into the liquid state, so that the paraffin can be functionally acted as a buffer endothermic pool during a thermal plateau period. Because the melting point of paraffin is 64° C., when the heat energy of the heat source 900 has not reached 64° C., the heat energy of the heat source 900 can be directly conducted to the heat dissipation fin set 100 through the thermal conductive block 210. On the contrary, when the heat energy of the heat source 900 reaches 64° C., the paraffin begins to absorb heat energy slowly so as to gradually transform into the liquid state to deal with the heat energy during the thermal plateau period.

The capillary tube 600 extends to be installed in both of the cold zone 222 and the hot zone 221 of the closed cavity 220. More specifically, the capillary tube 600 is provided with a first end 610 and a second end 620 which are opposite to each other. The first end 610 and the second end 620 of the capillary tube 600 are located in the cold zone 222 and the hot zone 221 of the closed cavity 220, respectively. Furthermore, but not limited thereto in the disclosure, the capillary tube 600 is bent, so that the first end 610 of the capillary tube 600 is bent to extend in a horizontal direction (e.g., X axis) and face towards the fin-array frame 300, and a specific gap 240 is formed between the fin-array frame 300 and the first end 610 of the capillary tube 600. Similarly, the second end 620 of the capillary tube 600 is bent to extend in the horizontal direction (e.g., X axis) and face towards the thermal phase change material 500. In this embodiment, since the inner wall of the capillary tube 600 is provided with capillaries (not shown in figures) for transporting the thermal phase change material 500 in the liquid state. For example, the capillary tube 600 is an aluminum tube or a copper tube. However, the present disclosure is not limited thereto.

More specifically, the heat dissipation fin set 100 includes a plurality of fin members 110 and heat pipes 120. However, the present disclosure is not limited thereto. The fin members 110 are parallel to each other and spaced arranged apart along the gravity direction (e.g., Z axis), and the heat pipes 120 are parallel to each other and spaced apart along the horizontal direction (e.g., X axis). The long axis of each of the heat pipe 120 is parallel to the direction of gravity (such as the Z axis), and each of the heat pipes 120 passes through all the fin members 110, and is thermally coupled to the thermal conductive block 210. In addition, the thermal conductive block 210 is further provided with a plurality of brackets 260, which are respectively located on the outer side wall 213 of the thermal conductive block 210, and are connected obliquely to one of the heat pipes 120 to provide more heat transfer paths.

The fin-array frame 300 is assembled by a plurality of metal sheets 310 according to an array method, and an air gap 320 is formed between any two adjacent ones of the metal sheets 310. The air gaps 320 of the fin-array frame 300 can be filled with a part of the filling gas 400, so heat energy can be conducted to the heat dissipation fin set 100 through the filling gas 400 and the metal sheets 310.

Furthermore, the thermal peak suppression device 10 further includes a heat dissipation fan 700. The heat dissipation fan 700 is connected to the heat dissipation fin set 100 for guiding airflow to the heat dissipation fin set 100. More specifically, in this embodiment, the heat dissipation fan 700 is placed on one side of the heat dissipation fin set 100, and able to generate or guide airflow into the air gaps 130 between the fin members 110 and the heat pipes 120, thereby removing the heat energy away from the heat dissipation fin set 100.

Figure 2:
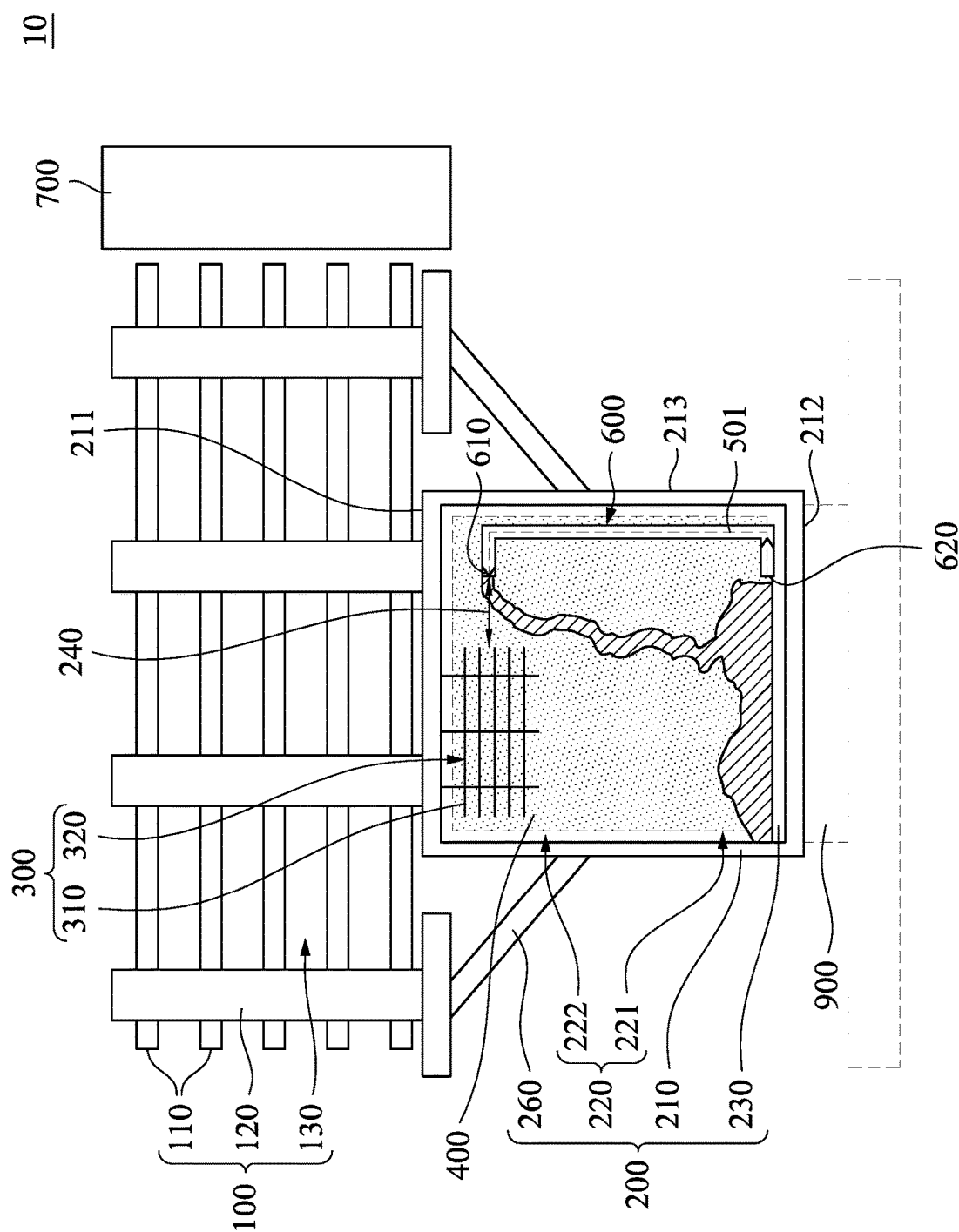
FIG. 2 is an operational schematic view of the thermal peak suppression device of FIG. 1.

FIG. 2 is an operational schematic view of the thermal peak suppression device of FIG. 1. As shown in FIG. 2, when the heat source 900 starts to produce heat energy, and the heat energy of the heat source 900 has not reached a threshold value (e.g., 64° C.) yet, the heat energy of the heat source 900 can be directly conducted to the heat dissipation fin set 100 through the thermal conductive block 210, and then taken away from the heat dissipation fin set 100. At this moment, the thermal phase change material 500 is still in a solid state.

Conversely, when the temperature of the heat energy of the heat source 900 rises to the threshold (e.g., 64° C.), the thermal phase change material 500 is gradually changed into a liquid state because the thermal phase change material 500 begins to absorb thermal energy, so that the thermal phase change material 500 becomes a buffer endothermic pool in the hot zone 221. Next, due to the capillary phenomenon, the liquid 501 of the thermal phase change material 500 in the liquid state begins to infiltrate into the capillary tube 600 from the second end 620 of the capillary tube 600, and is guided to the first end 610 of the capillary tube 600 within the capillary tube 600.

In this way, through the heat dissipation effect of the filling gas 400 and the fin-array frame 300 in the cold zone 222, the thermal phase change material 500 discharges heat to be cooled so as to transform into a solid thermal phase change material 500, and then the solid thermal phase change material 500 is pushed outwards from the first end 610 of the capillary tube 600. One part of the thermal phase change material 500 being pushed outwards from the first end 610 of the capillary tube 600 will fall downwardly to the hot zone 221 of the closed cavity 20 through the specific gap 240, and then returns to the thermal phase change material 500 in the hot zone 221.

Figure 3:
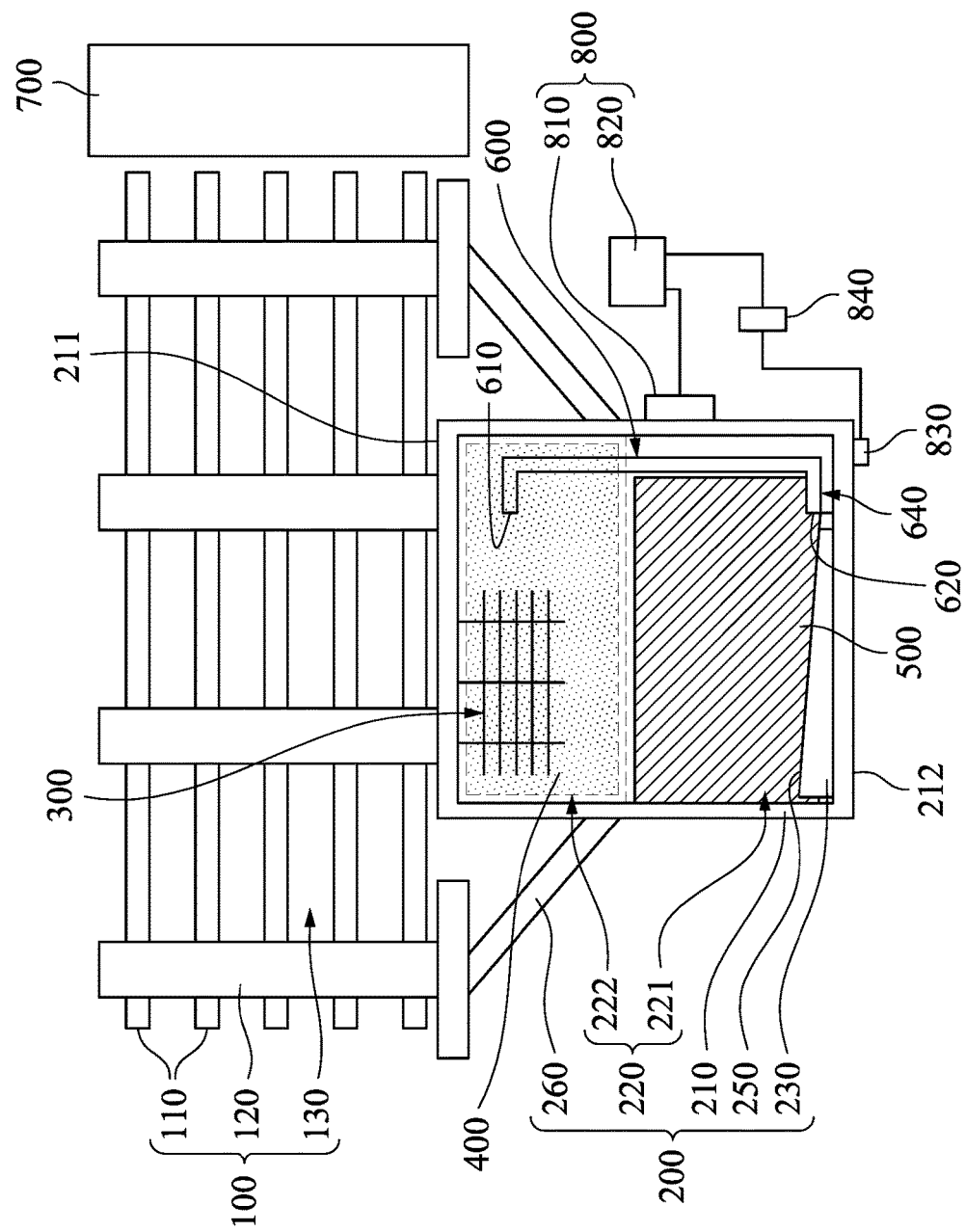
FIG. 3 is a schematic view of a thermal peak suppression device according to one embodiment of the present disclosure.

FIG. 3 is a schematic view of a thermal peak suppression device 11 according to one embodiment of the present disclosure. As shown in FIG. 3, the thermal peak suppression device 11 of FIG. 3 is substantially the same to the thermal peak suppression device 10, except that the thermal peak suppression device 11 further includes a vibration device (vibrator) 800. The vibration device 800 is connected to the heat dissipator 200 for generating and sending vibrations to the heat dissipator 200 and the capillary tube 600. The capillary tube 600 is fixedly connected to an inner wall of the closed cavity 220. Thus, while the thermal phase change material 500 is sent within the capillary tube 600, the vibration of the vibration device 800 to the capillary tube 600 can accelerate the rate of the capillary phenomenon, thereby improving the heat dissipation efficiency.

For example, but not limited thereto, the vibration device 800 includes an ultrasonic piezoelectric ceramic sheet 810 and a driving unit (driver) 820. The ultrasonic piezoelectric ceramic sheet 810 is directly connected to a surface of the thermal conductive block 210 for generating ultrasonic waves to the capillary tube 600. The driving unit 820 is electrically connected to the ultrasonic piezoelectric ceramic sheet 810 for activating and driving the ultrasonic piezoelectric ceramic sheet 810 to operate. Thus, since the ultrasonic wave oscillates the thermal phase change material 500, numerous tiny vacuum bubbles will be generated and continuously generated and extinguished. The shock wave generated by the rupture will push the liquid thermal phase change material 500 to diffuse outwardly, thereby accelerating the heat dissipation cycle mentioned above.

In the embodiment, the thermal peak suppression device 11 further includes a temperature detection unit (temperature detector) 830 and a temperature switch 840. The temperature detection unit 830 is disposed on one side of the thermal conductive block 210 opposite to the heat dissipation fin set 100 for detecting a temperature of the thermal conductive block 210. The temperature switch 840 is electrically connected to the vibration device 800 and the temperature detection unit 830 for activating the vibration device. Thus, when the temperature detection unit 830 detects that the temperature of the closed cavity 220, the thermal conductive block 210 or the heat source 900 has not reached a threshold value (e.g., 64° C.) yet, the temperature switch 840 refuses to activate or shuts down the vibration device 800 in response to a detection result of the temperature detection unit 830. On the contrary, when the temperature detection unit 830 detects that the temperature of the closed cavity 220, the thermal conductive block 210 or the heat source 900 has reached the threshold value (e.g., 64° C.), the temperature switch activates the vibration device 800 in response to a detection result of the temperature detection unit 830.

The heat dissipator 200 is further provided with a sloping guiding surface 250 for guiding the thermal phase change material 500 within the closed cavity 220 to the second end 620 of the capillary tube 600. More specifically, the sloping guiding surface 250 is disposed on the bump 230 opposite to the second side wall 212 of the thermal conductive block 210. However, the disclosure is not limited thereto. As long as the thermal phase change material 500 can be guided to the second end 620 of the capillary tube 600, the present disclosure is not limited to the sloping guiding surface 250 being located on the inner wall of the closed cavity 220 corresponding to the hot zone 221.

Figure 4:
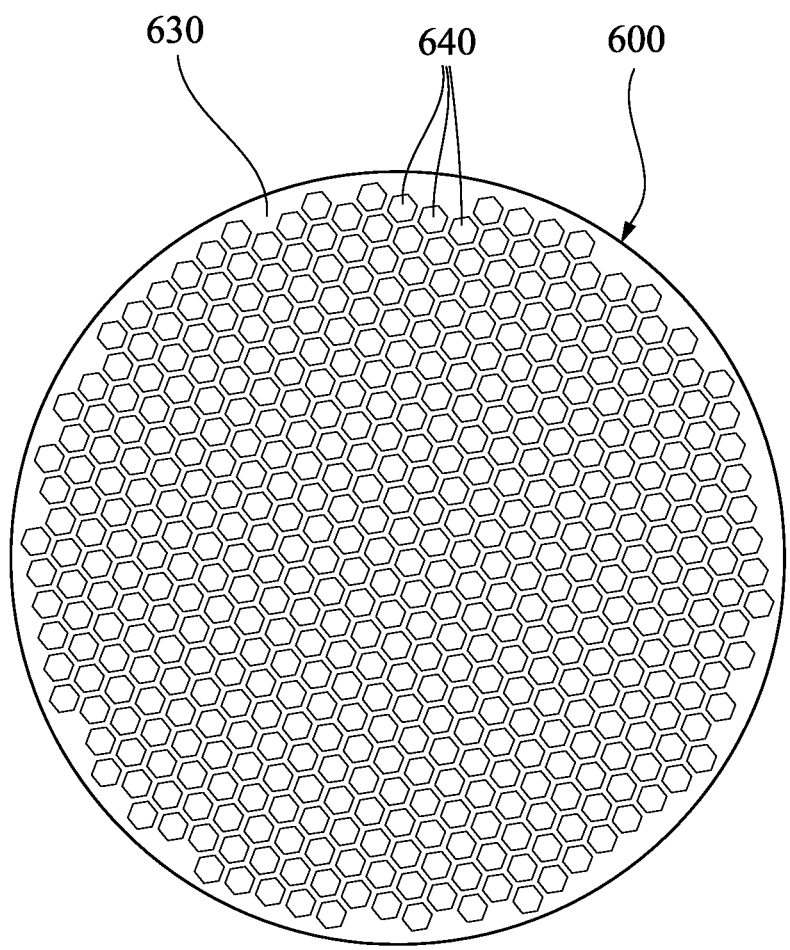
FIG. 4 is a schematic cross-sectional view of a capillary tube according to one embodiment of the present disclosure.

FIG. 4 is a schematic cross-sectional view of a capillary tube according to one embodiment of the present disclosure. As shown in FIG. 4, a cross section of the capillary tube 600 includes a honeycomb porous section 630. More specifically, the capillary tube 600 is provided with a plurality of capillary channels 640 that are spaced arranged abreast inside the capillary tube 600. Each of the capillary channels 640 is provided with two opposite ends facing towards the fin-array frame 300 (FIG. 1) located within the cold zone 222 and the thermal phase change material 500 located within the hot zone 221, respectively. The cross section of each of the capillary channels 640 is hexagonal. However, the present disclosure is not limited to its cross-sectional shape.

Thus, through the construction of the embodiments above, the present disclosure is able to provide heat suppression function when the semiconductor chip generates high heat energy, thereby effectively suppressing the high heat energy of the semiconductor chip, so as to improve the heat dissipation efficiency, and reduce the possibilities of the semiconductor chip being overheated and destroyed.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A thermal peak suppression device, comprising:
   a heat dissipation fin set;
   a heat dissipator having a thermal conductive block that is thermally coupled to the heat dissipation fin set, and a closed cavity that is formed inside the thermal conductive block and divided into a hot zone and a cold zone being in communication with each other;
   a thermal phase change material disposed within the hot zone, and used to absorb and discharge heat energy by performing a phase transition between a liquid state and a solid state;
   a filling gas disposed within the cold zone, wherein a specific heat capacity of the filling gas is 2000 to 6000 joules/Kg·Kelvin;
   a fin-array frame disposed within the cold zone, and fixedly connected to the thermal conductive block; and
   a capillary tube having a first end and a second end which are opposite to each other, wherein the first end and the second end of the capillary tube are respectively located within the cold zone and the hot zone,
   wherein when the thermal phase change material is transformed into the liquid state, the thermal phase change material in the liquid state is sent to the hot zone of the closed cavity from the cold zone through the capillary tube.

2. The thermal peak suppression device of claim 1, wherein the capillary tube is provided with a plurality of capillary channels that are spaced arranged abreast inside the capillary tube, and each of the capillary channels is provided with two opposite ends facing towards the fin-array frame and the thermal phase change material, respectively.

3. The thermal peak suppression device of claim 1, wherein a gap is formed between the fin-array frame and the first end of the capillary tube,
   wherein when the thermal phase change material that is in the liquid state and disposed within the cold zone is transformed into the solid state, the thermal phase change material falls downwardly from the first end of the capillary tube to the hot zone of the closed cavity through the gap.

4. The thermal peak suppression device of claim 1, wherein the heat dissipator is further provided with a sloping guiding surface disposed within the closed cavity for guiding the thermal phase change material to the second end of the capillary tube.

5. The thermal peak suppression device of claim 1, wherein a cross section of the capillary tube comprises a honeycomb porous section.

6. The thermal peak suppression device of claim 1, further comprising:
   a vibrator connected to the heat dissipator for generating and sending vibrations to the heat dissipator and the capillary tube, wherein the capillary tube is fixedly connected to an inner wall of the closed cavity.

7. The thermal peak suppression device of claim 6, wherein the vibrator comprises:
   an ultrasonic piezoelectric ceramic sheet directly connected to a surface of the thermal conductive block for generating ultrasonic waves to the capillary tube; and
   a driver electrically connected to the ultrasonic piezoelectric ceramic sheet for activating and driving the ultrasonic piezoelectric ceramic sheet to operate.

8. The thermal peak suppression device of claim 6, further comprising:
   a temperature detector disposed on one side of the thermal conductive block opposite to the heat dissipation fin set for detecting a temperature of the thermal conductive block; and
   a temperature switch electrically connected to the vibrator and the temperature detector for activating the vibrator,
   wherein when the temperature detector detects that the temperature of the thermal conductive block reaches a threshold value, the temperature switch activates the vibrator in response to a detection result of the temperature detector.

9. The thermal peak suppression device of claim 1, further comprising:
   a heat dissipation fan connected to the heat dissipation fin set for guiding airflow to the heat dissipation fin set.

10. The thermal peak suppression device of claim 1, wherein the filling gas is one of ammonia gas and helium gas.

11. The thermal peak suppression device of claim 1, wherein the thermal phase change material is one of paraffin and fatty acid.

* * * * *